United States Patent
Smetana (10) Patent No.: US 6,566,912 B1
(45) Date of Patent: May 20, 2003

(54) INTEGRATED XOR/MULTIPLEXER FOR HIGH SPEED PHASE DETECTION

(75) Inventor: Kenneth Smetana, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/135,112

(22) Filed: Apr. 30, 2002

(51) Int. Cl.[7] .............................................. H03D 13/00
(52) U.S. Cl. ........................ 327/12; 327/99; 327/411; 326/52
(58) Field of Search ............................ 327/2, 3, 12, 52, 327/63, 64, 65, 96, 97, 99, 355, 359, 407, 411, 432; 326/52, 54, 55

(56) References Cited

U.S. PATENT DOCUMENTS

| | | | | |
|---|---|---|---|---|
| 3,639,781 A | * | 2/1972 | Marley ........................ 326/105 |
| 4,628,216 A | * | 12/1986 | Mazumder .................. 326/126 |
| 4,831,579 A | * | 5/1989 | Hara et al. .................. 708/701 |
| 5,252,865 A | * | 10/1993 | Davenport et al. ............ 327/3 |
| 5,260,952 A | * | 11/1993 | Beilstein, Jr. et al. ...... 714/816 |
| 5,315,176 A | * | 5/1994 | Popescu ...................... 326/126 |
| 5,801,571 A | * | 9/1998 | Allen et al. .................. 327/407 |
| 5,909,127 A | * | 6/1999 | Pearson et al. ............. 326/115 |
| 6,008,670 A | * | 12/1999 | Pace et al. ................... 326/115 |
| 6,137,309 A | * | 10/2000 | Couteaux et al. ............. 326/55 |
| 6,194,917 B1 | * | 2/2001 | Deng .......................... 327/12 |
| 6,414,519 B1 | * | 7/2002 | Abernathy .................. 326/127 |
| 6,424,194 B1 | * | 7/2002 | Hairapetian ................. 327/210 |

* cited by examiner

*Primary Examiner*—Timothy P. Callahan
*Assistant Examiner*—Hai L. Nguyen
(74) *Attorney, Agent, or Firm*—Gary Cary Ware & Freidenrich; Terrance A. Meador (57) ABSTRACT

A high speed phase detector utilizes an integrated XOR/MUX circuit having a higher bandwidth and lower power than conventional designs. The XOR/MUX circuit combines the functionality of an XOR device in series with a multiplexer in a manner that increases the bandwidth of the function. In a practical implementation, the XOR/MUX circuit includes an XOR arrangement having a plurality of transistors implemented at a first transistor level and a plurality of transistors implemented at a second transistor level. The XOR/MUX circuit also includes transistors implemented at a third transistor level; these transistors are utilized by the multiplexer feature of the circuit.

23 Claims, 7 Drawing Sheets

INTEGRATED XOR/MULTIPLEXER FOR HIGH SPEED PHASE DETECTION

RELATED APPLICATION

The subject matter described herein is related to the subject matter of U.S. patent application Ser. No. 10/135,415, titled "INTEGRATED XOR/SUMMER/MULTIPLEXER FOR HIGH SPEED PHASE DETECTION," the content of which is incorporated by reference herein.

FIELD OF THE INVENTION

The present invention relates generally to digital and analog circuit design. More particularly, the present invention relates to a digital circuit that combines the functionality of an XOR gate in series with a multiplexer.

BACKGROUND OF THE INVENTION

Figure 1:
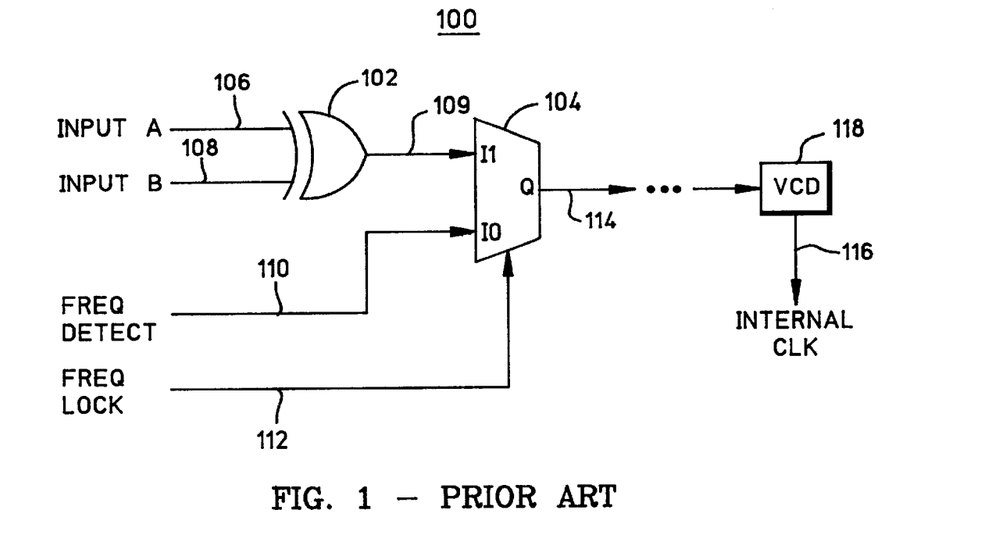
FIG. 1 is a block diagram of a prior art digital circuit.

High speed digital data communication devices utilize phase detector circuits to produce an output voltage proportional to the frequency or phase differences of two input signals. During frequency acquisition, the frequency of an incoming data signal is compared to the frequency of an external reference clock. During phase acquisition, incoming data is compared to a derived version of an internal reference clock (usually generated by a voltage controlled oscillator). FIG. 1 is a block diagram of a prior art digital circuit 100 that may be utilized in a phase detector application. Circuit 100 includes an XOR component 102 and a multiplexer 104 connected in series with XOR component 102. One input to XOR component 102 represents a first half-rate data signal 106 based upon an input data signal (not shown), and the other input to XOR component 102 represents a second half-rate data signal 108 based upon the input data signal. In this regard, one input to XOR component 102 includes the "odd" data bits from the input data signal and the other input to XOR component 102 includes the "even" data bits from the input data signal. The output of XOR component 102 represents a phase detect signal 109. Circuit 100 also receives a frequency detect signal 110 from a frequency detection circuit (not shown) and a frequency lock signal 112 (frequency lock signal 112 serves as a selection signal for multiplexer 104). Ultimately, circuit 100 generates an output signal 114—the output of multiplexer 104.

Circuit 100 utilizes output signal 114 to adjust the frequency and phase of a clock signal 116 generated by a voltage controlled oscillator (VCO) 118. Initially, circuit 100 selects frequency detect signal 110 (using multiplexer 104) for use as output signal 114, which controls the operation of VCO 118 such that the frequency of clock signal 116 matches the frequency of a reference clock signal, which corresponds to the frequency of the incoming data signal. Thereafter, circuit 100 selects phase detect signal 109 (using multiplexer 104) for use as output signal 114, which controls the operation of VCO 118 such that the phase of clock signal 116 is properly aligned relative to the phase of the input data signal.

Figure 2:
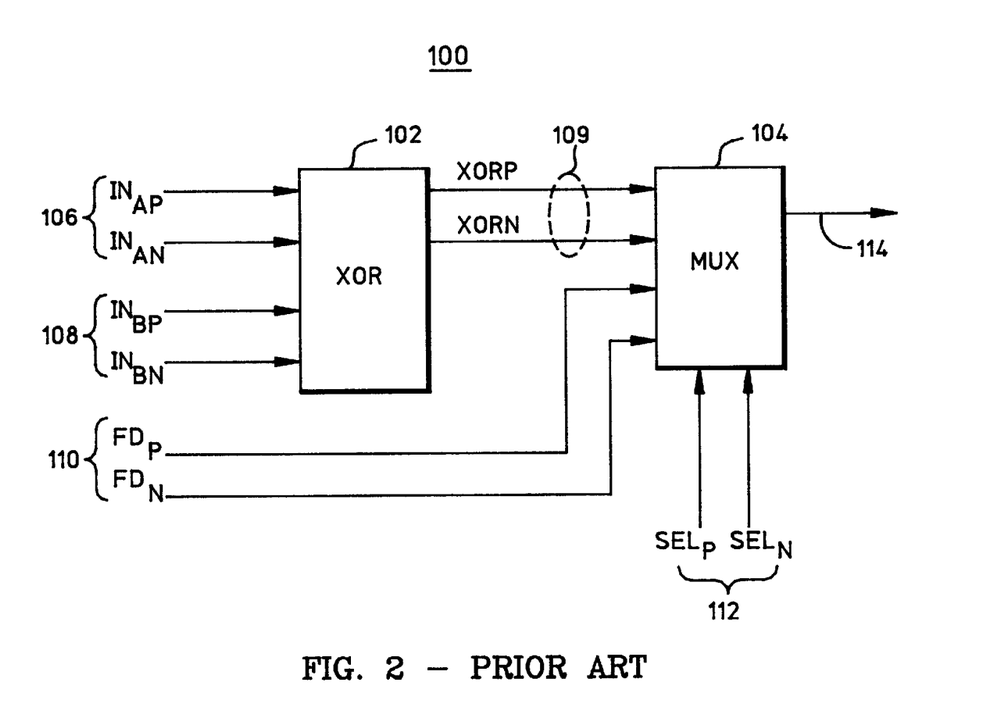
FIG. 2 is a block diagram representing a practical implementation of t shown in FIG. 1.

FIG. 2 is a schematic representation of circuit 100 as implemented in a practical device. In a practical high speed application, circuit 100 handles differential input signals and generates a single ended output signal 114. Accordingly, first XOR input signal 106 is represented by a positive or "true" signal ($IN_{AP}$) and a negative or "complementary" signal ($IN_{AN}$), second XOR input signal 108 is represented by a positive signal ($IN_{BP}$) and a negative signal ($IN_{BN}$), and phase detect signal 109 is represented by a positive signal ($XOR_P$) and a negative signal ($XOR_N$). Likewise, frequency detect signal 110 is represented by a positive signal ($FD_P$) and a negative signal ($FD_N$), and frequency lock signal 112 is represented by a positive signal ($SEL_P$) and a negative signal ($SEL_N$).

Figure 3:
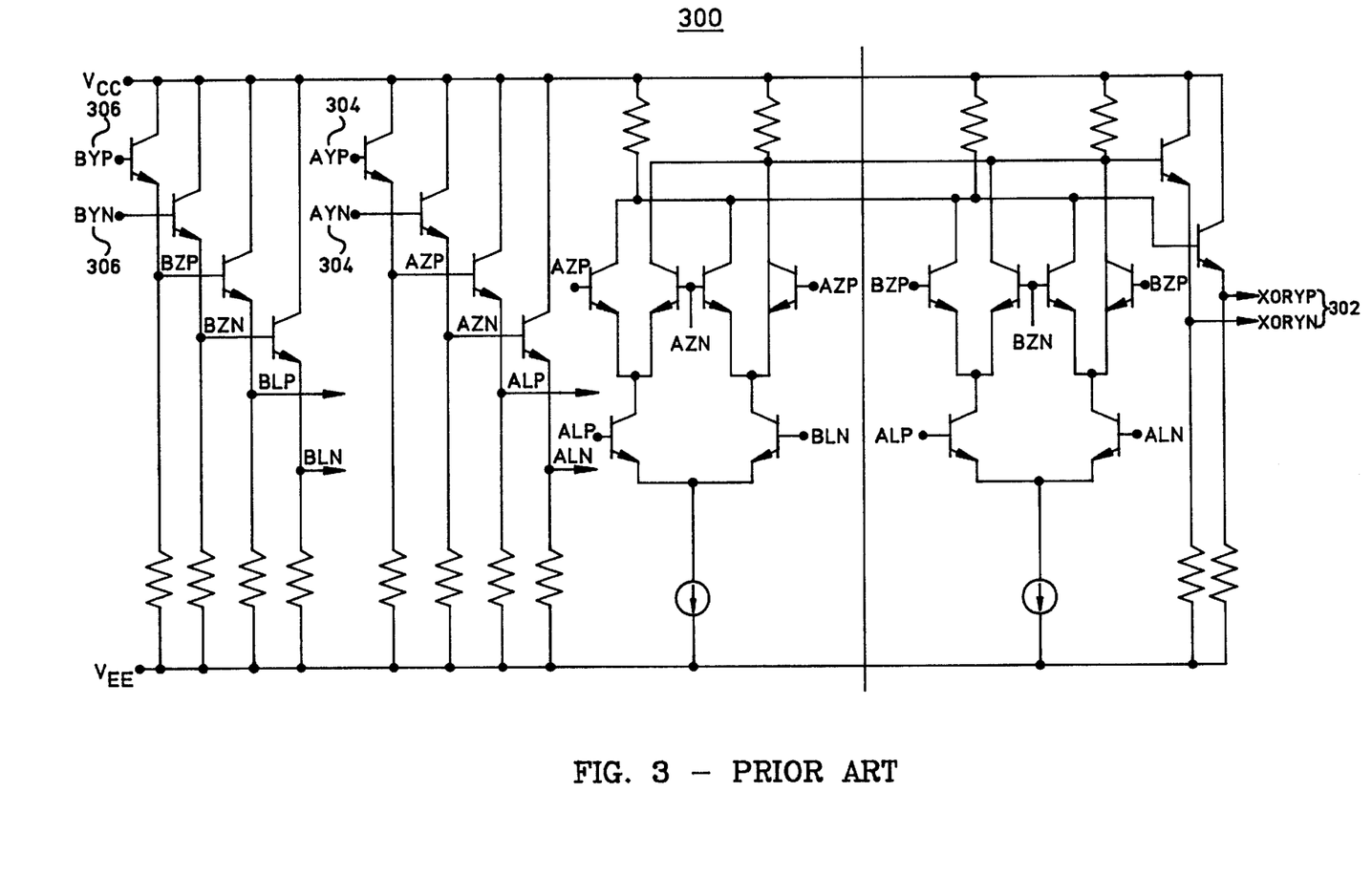
FIG. 3 is a schematic diagram of a prior art XOR component.
Figure 4:
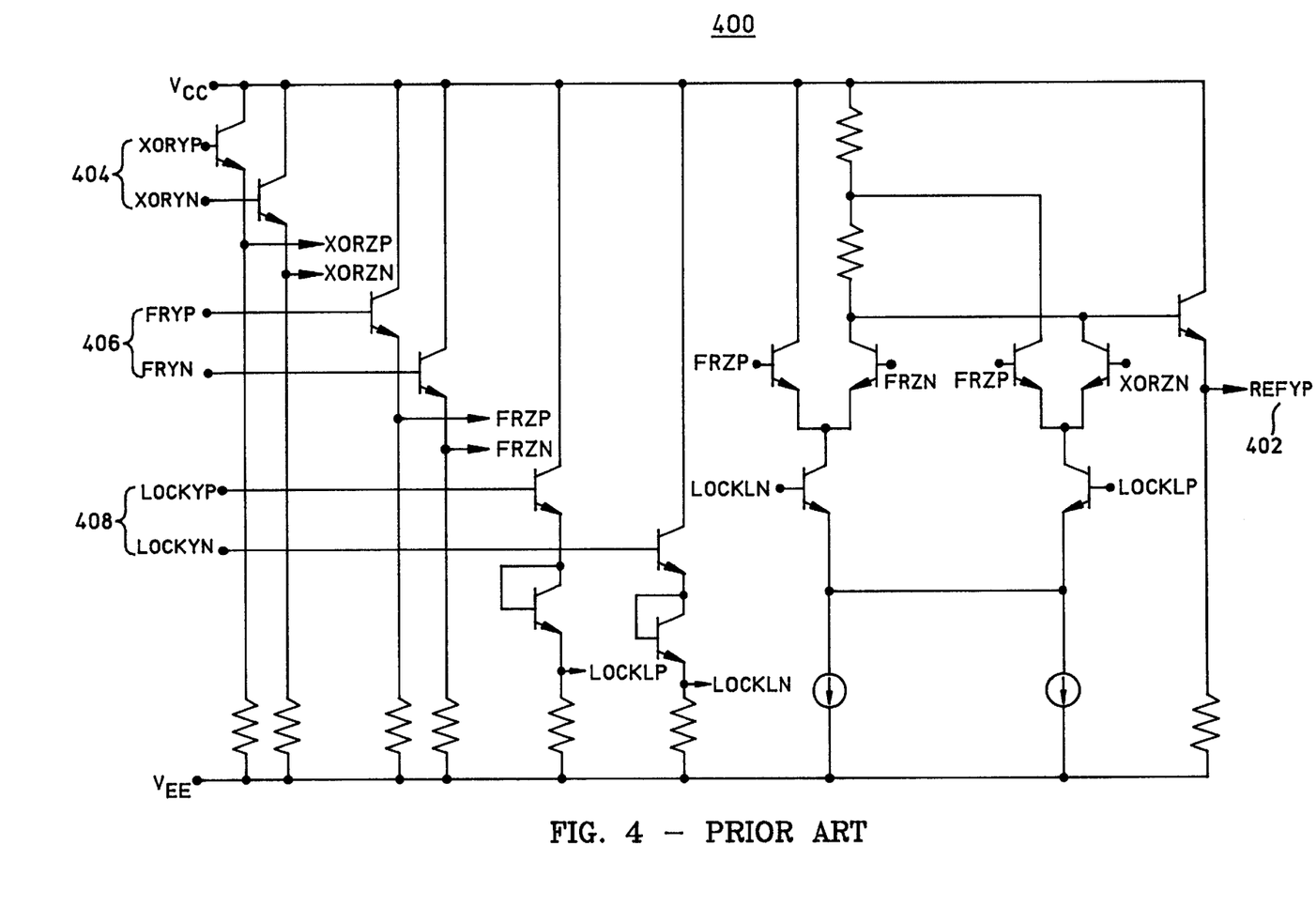
FIG. 4 is a schematic diagram of a prior art multiplexer.

Circuit 100 is implemented such that the transistors, resistors, and other features of XOR component 102 are physically distinct from the transistors, resistors, and other features of multiplexer 104. In this regard, FIG. 3 is a schematic of a prior art XOR component 300, and FIG. 4 is a schematic of a prior art multiplexer 400. XOR component 300 is designed to operate as an independent device that generates a differential XOR output 302 based upon two differential input signals 304/306, and multiplexer 400 is designed to operate as an independent device that selects an output signal 402 from two differential input signals 404/406 based upon the state of a differential select signal 408. Referring back to FIG. 2, in a practical implementation, XOR component 102 is physically connected to multiplexer 104 using conductive traces configured to carry phase detect signal 109 between the components.

Circuit 100, while suitable for relatively low speed data communication applications (e.g., those handling data rates of 2.5 Gbps or less), is not suitable for relatively high speed applications (e.g., those handling data rates up to or beyond 40 Gbps). In very high speed applications, the limited bandwidth of circuit 100 adversely affects its performance. Furthermore, circuit 100 requires separate current sources (one or more for XOR component 102 and one or more for multiplexer 104), which results in an inefficient use of operating power.

BRIEF SUMMARY OF THE INVENTION

A digital circuit according to the present invention includes the functionality of an XOR component integrated with the functionality of a multiplexer. The combined function of the digital circuit is equivalent to a distinct XOR component connected in series with a distinct multiplexer. The integrated configuration enables the circuit to achieve higher bandwidth than equivalent prior art circuits, while using less operating power.

The above and other aspects of the present invention may be carried out in one form by an integrated XOR/MUX device having: an XOR arrangement having a first collector node, a second collector node, and a first common emitter node, where the XOR arrangement is configured to perform an XOR operation on a first differential input signal and a second differential input signal; a first differential transistor pair having a second common emitter node connected to a current source, a third collector node connected to the first common emitter node, and a fourth collector node, where the first differential transistor pair is configured to receive a differential select signal; and a second differential transistor pair having a third common emitter node connected to the fourth collector node, a fifth collector node connected to a reference voltage node, and a sixth collector node connected to the first collector node, where the second differential transistor pair is configured to received a third differential input signal.

BRIEF DESCRIPTION OF THE DRAWINGS

A more complete understanding of the present invention may be derived by referring to the detailed description and claims when considered in conjuction with the following Figures, wherein like reference numbers refer to similar elements throughout the Figures.

DETAILED DESCRIPTION OF A PREFERRED EMBODIMENT

The specific circuits shown and described herein are illustrative of the invention and its best mode and are not intended to otherwise limit the scope of the invention in any way. Indeed, for the sake of brevity, conventional aspects of microelectronic design techniques, semiconductor fabrication techniques, digital logic techniques, and other functional aspects of the circuits (and the individual operating components of the circuits) may not be described in detail herein. In addition, the present invention may be practiced in conjunction with any number of digital/analog circuit applications and the system described herein is merely one exemplary application for the invention.

Figure 5:
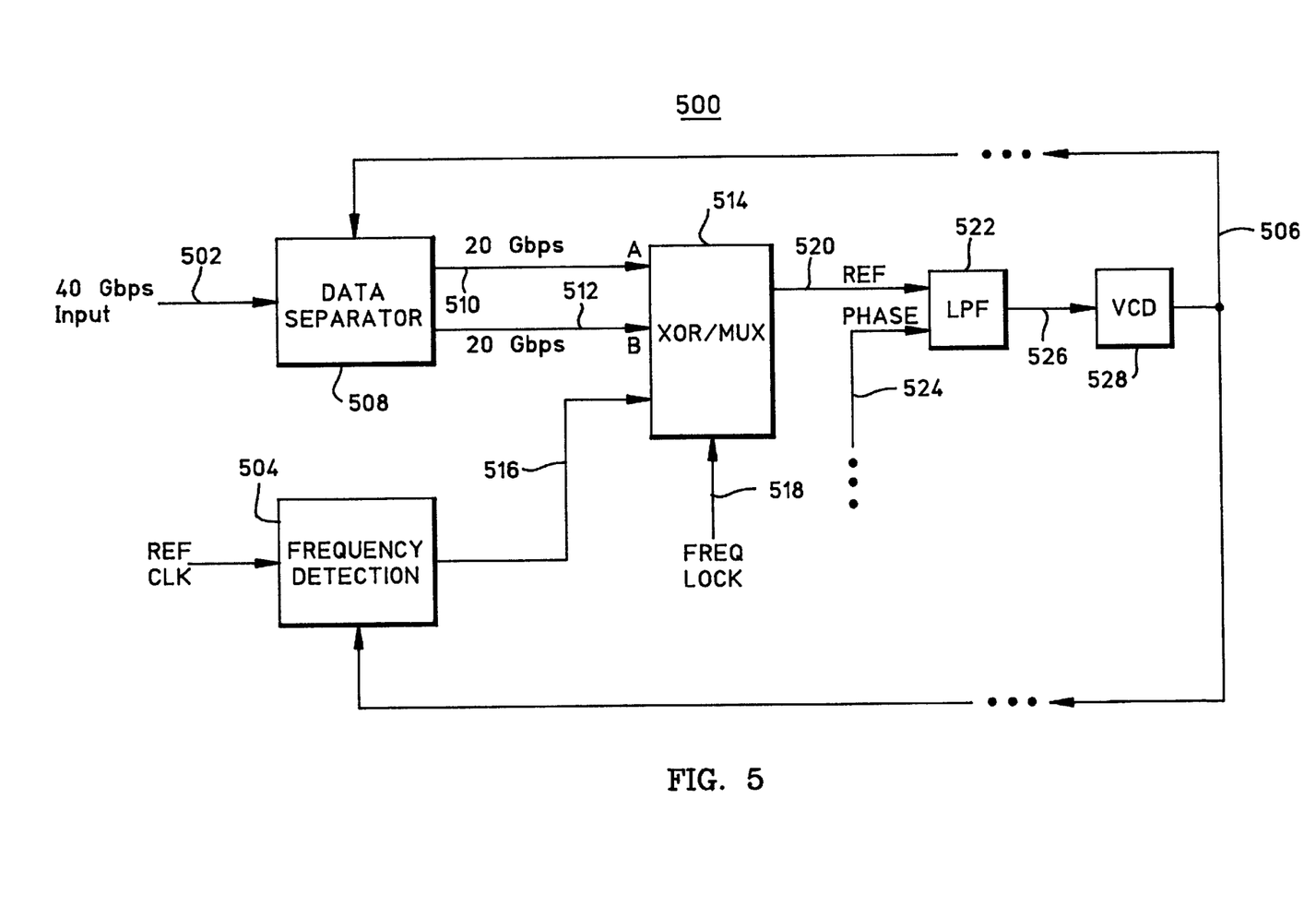
FIG. 5 is a block diagram of an example phase detector circuit in which the present invention may be implemented.

FIG. 5 is a block diagram of a digital circuit 500 that may utilize a practical embodiment of the present invention. Briefly, circuit 500 is a phase detection circuit that receives a digital data input signal 502, performs a frequency detection procedure 504 to generate an internal clock 506 having a frequency that matches the frequency of input signal 502, and performs a phase detection procedure to align the frequency-matched internal clock 506 relative to input signal 502. In one practical embodiment, circuit 500 is suitably configured to accommodate an input signal having a data rate of 40 Gbps (and possibly higher data rates). The various signals depicted in FIG. 5 are typically realized as differential signals, each having a true component and a complementary component. For the sake of clarity, however, these signals are represented by single interconnecting lines in FIG. 5.

Circuit 500 may include a "data separator" arrangement 508 configured to separate the incoming input signal 502 into a first input signal 510 and a second input signal 512 (input signals 510/512 collectively convey the same digital data found in input signal 502). In the example embodiment, input signal 510 contains the odd bit data from input signal 502, and input signal 512 contains the even bit data from input signal 502 (alternatively, the even/odd bit data distribution can be reversed). The data rate of input signals 510/512 is half the data rate of input signal 502. In this regard, the example circuit 500 generates a 20 Gbps input signal 510 and a 20 Gbps input signal 512. In practice, data separator arrangement 508 may split input signal 502 into two branches and latch the data in each branch using complementary clocks derived from internal clock 506. Ultimately, input signals 510/512 convey information related to the phase of internal clock 506 relative to input signal 502.

Circuit 500 also includes an integrated XOR/MUX circuit 514, which receives input signals 510/512, a frequency detect signal 516 (generated by the frequency detection procedure 504), and a frequency lock signal 518. Frequency lock signal 518 functions as a select signal for XOR/MUX circuit 514 such that, in a first operating mode, the output of XOR/MUX circuit 514 corresponds to frequency detect signal 516, and such that, in a second operating mode, the output of XOR/MUX circuit 514 corresponds to the result of an XOR operation performed on input signals 510/512. The output of XOR/MUX circuit 514 is a single ended "reference" signal 520 that serves as one input to a low pass filter 522. Low pass filter 522 also receives a single ended "phase" signal 524 as a second input.

The output signal 526 of low pass filter 522 is directed to a voltage controlled oscillator (VCO) 528, which is configured to generate internal clock 506 in response to the output signal 526; VCO 528 modifies the frequency and/or phase of internal clock 506 in accordance with signal 526. In this regard, signal 526 serves as a VCO adjustment or control signal. As shown in FIG. 5, internal clock 506 (or a clock derived therefrom) may be utilized by data separator arrangement 508 and/or by frequency detection procedure 504.

As described in more detail below, the present invention is embodied in XOR/MUX circuit 514. Consequently, circuit 500 may utilize a number of known and conventional techniques (in addition to the techniques of the present invention) to perform phase detection.

Figure 6:
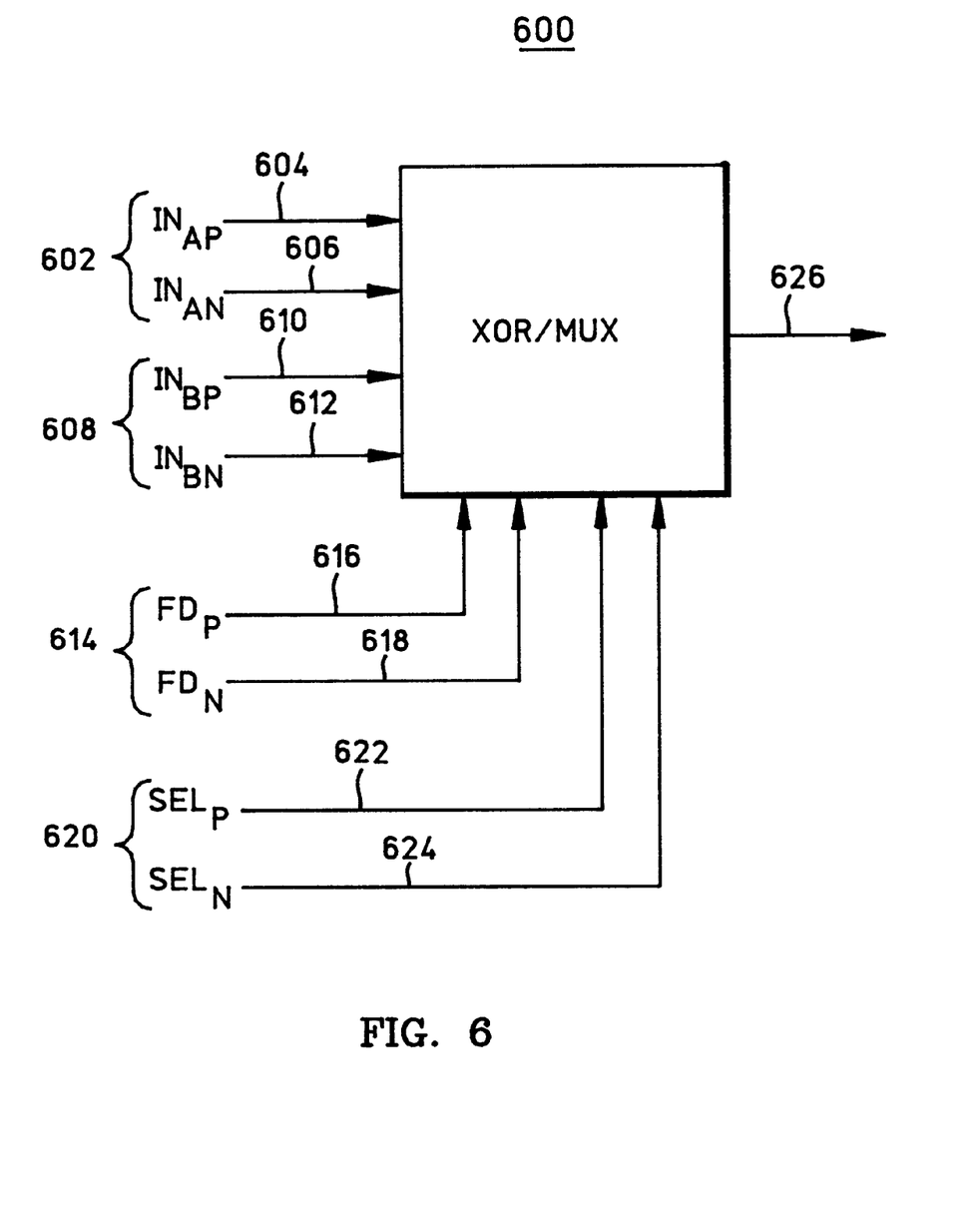
FIG. 6 is a block diagram of a digital circuit according to the present invention.

FIG. 6 is a block diagram of an integrated XOR/MUX circuit 600 according to the present invention. Circuit 600 represents one practical implementation of XOR/MUX circuit 514 (shown in FIG. 5). Circuit 600 is configured to receive a first differential input signal 602, which includes a true component 604 and a complementary component 606, and a second differential input signal 608, which includes a true component 610 and a complementary component 612. Circuit 600 is also configured to receive a third differential input signal 614, which includes a true component 616 and a complementary component 618, and a differential select signal 620, which includes a true component 622 and a complementary component 624. Circuit 600 generates a single ended output signal 626 in response to select signal 620. Depending upon the state of select signal 620, output signal 626 represents either third differential input signal 614 or an XOR output signal derived from first and second differential input signals 602/608.

In the example embodiment described herein, first differential input signal 602 represents a half-rate data signal containing the odd bit data from a full-rate input data signal (not shown in FIG. 6), and second differential input signal 608 represents another half-rate data signal containing the even bit data from the full-rate input data signal. In the example embodiment, third differential input signal 614 represents a frequency detect signal generated by a suitable frequency detection procedure or architecture, and differential select signal 620 represents a frequency lock signal (when signal 620 conveys a logic high, the frequency detect signal 614 is selected as the output signal 626; when signal 620 conveys a logic low, circuit 600 selects the XOR output signal as output signal 626).

Notably, XOR/MUX circuit 600 is realized on a single substrate as an integrated component or device. In contrast to the prior art circuit 100 shown in FIG. 2, circuit 600 does not include conductive signal traces that connect a distinct XOR feature to a distinct multiplexer feature. In other words, circuit 600 does not include a distinct multiplexer that receives, as one input, an XOR output signal generated by a distinct XOR element and another input containing frequency detect information.

Figure 7A:
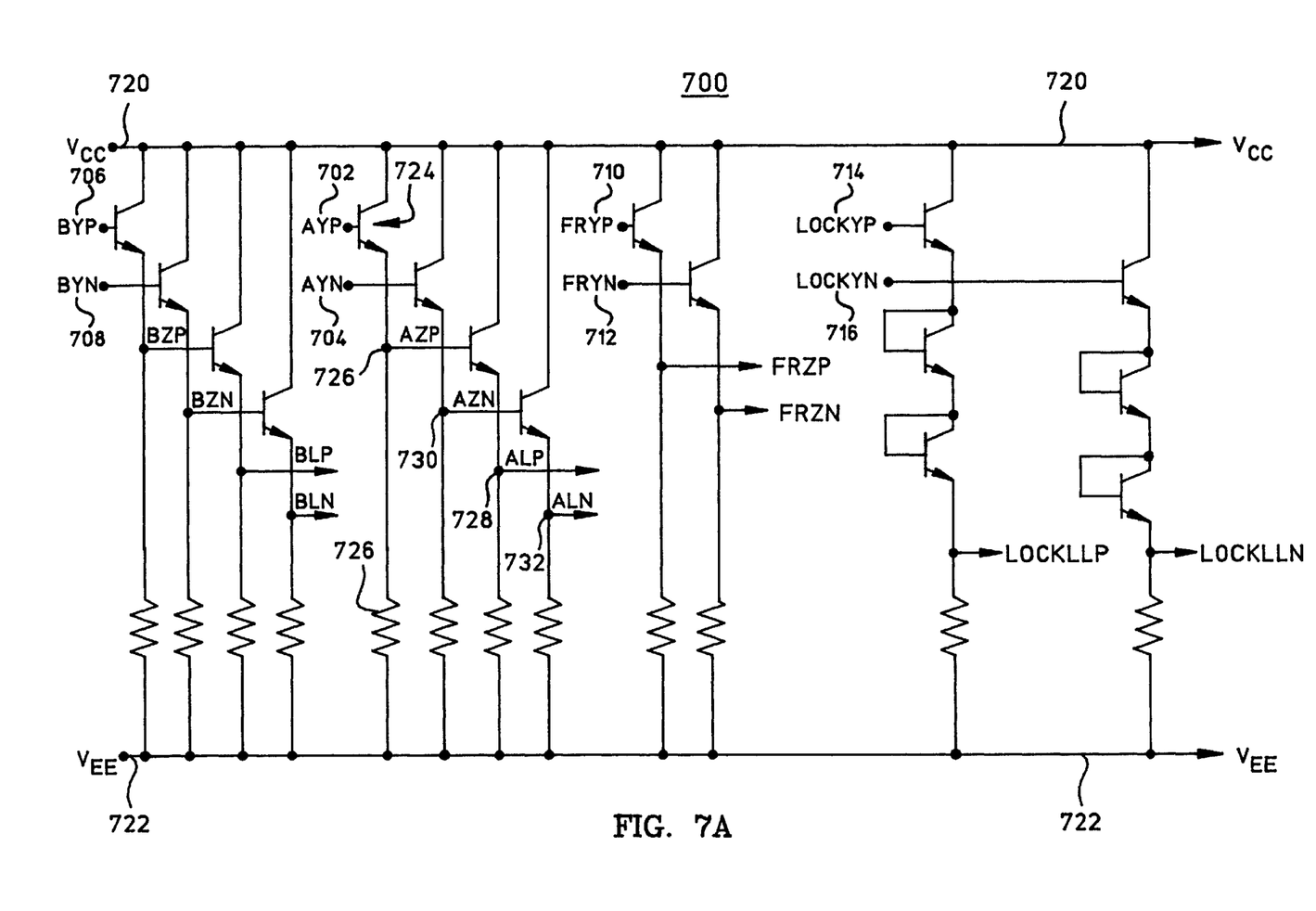
FIG. 7 is a schematic diagram of an example implementation of the circuit shown in FIG. 6.
Figure 7B:
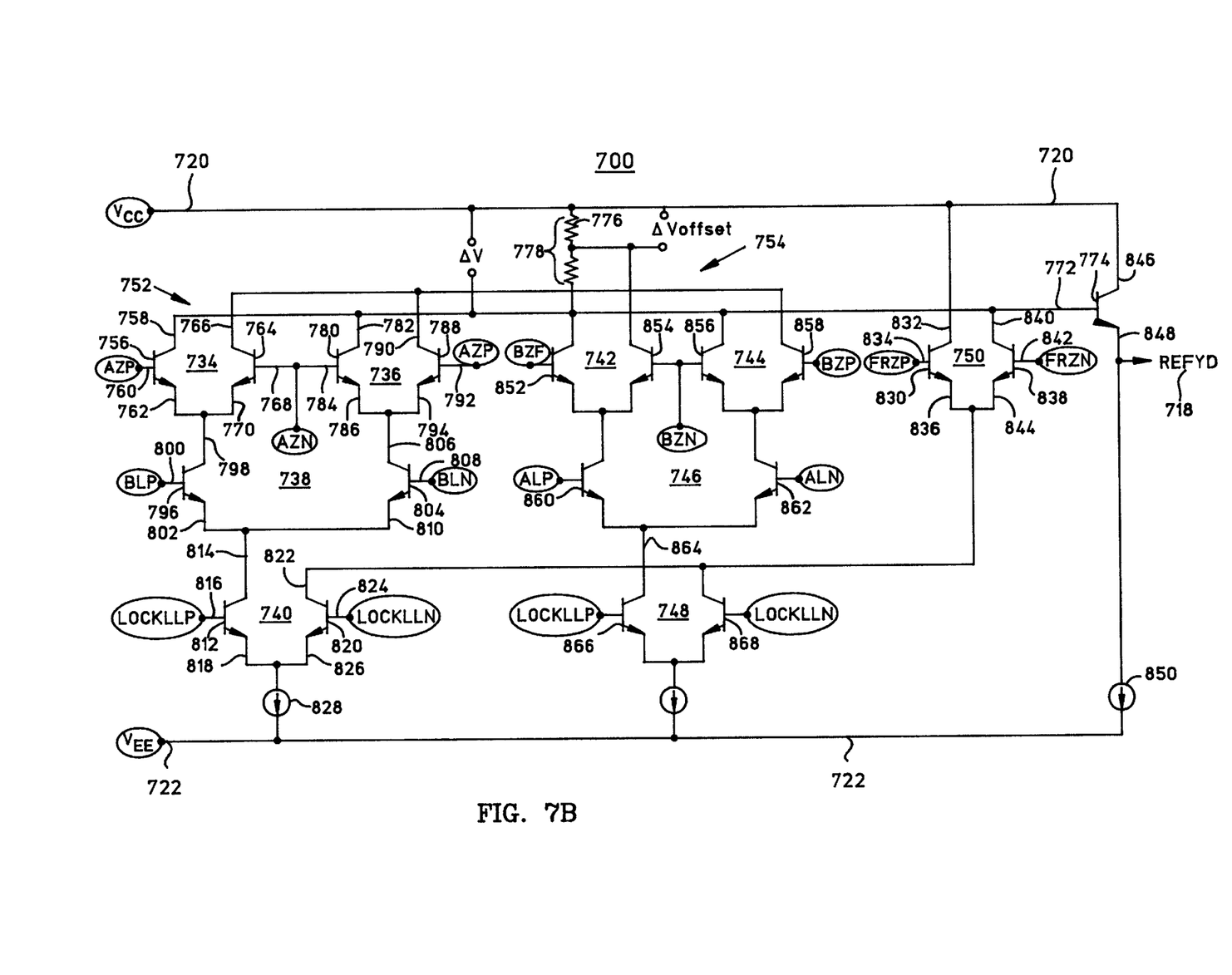

FIG. 7 is a schematic diagram of an example implementation of an XOR/MUX circuit 700. A portion of circuit 700 is shown in FIG. 7A and the remainder of circuit 700 is shown in FIG. 7B. In practical embodiments, circuit 700 is realized on a single semiconductor die. Circuit 700 represents one preferred embodiment that utilizes a number of NPN bipolar junction transistors. Alternate embodiments of the present invention may utilize PNP bipolar junction transistors, CMOS transistors, and possibly other technologies and processes for implementing digital logic circuits.

The following description of circuit 700 refers to "nodes" corresponding to transistors, voltage supplies, and other points within circuit 700. As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description of circuit 700 refers to nodes or features being "connected" or "coupled" together. As used herein, unless expressly stated otherwise, "connected" means that one node/feature is directly or indirectly connected to another node/feature. Likewise, unless expressly stated otherwise, "coupled" means that one node/feature is directly or indirectly coupled to another node/feature. Thus, although the schematic shown in FIG. 7 depicts one example arrangement of elements, additional intervening elements, devices, features, or components may be present in an actual embodiment (assuming that the functionality of circuit 700 is not adversely affected).

Briefly, circuit 700 is configured to receive at least the following signals: a first differential input signal, which includes a true component 702 and a complementary component 704 corresponding to the true component 702; a second differential input signal, which includes a true component 706 and a complementary component 708 corresponding to the true component 706; a third differential input signal, which includes a true component 710 and a complementary component 712 corresponding to the true component 710; and a differential select signal, which includes a true component 714 and a complementary component 716 corresponding to the true component 714. Circuit 700 is suitably configured to process the various input signals and to generate an output signal 718. To suit the needs of the example phase detector implementation, output signal 718 is a single ended output. Alternate embodiments of circuit 700 may be configured to generate a differential output signal if necessary for the particular application.

In accordance with conventional digital logic circuit design, circuit 700 utilizes two reference voltages provided by suitable voltage sources (not shown in FIG. 7). In the example embodiment, the Vcc reference voltage is maintained at 0.0 volts, and the Vee reference voltage is maintained at −5.2 volts. Circuit 700 maintains the Vcc reference voltage at a reference voltage node 720, and the Vee reference voltage at a reference voltage node 722. As shown in FIG. 7, a number of devices and components can be connected to reference voltage node 720 and/or to reference voltage node 722.

In the example embodiment, the first and second differential input signals are transformed by respective input follower architectures to obtain equivalent differential input signals at specific voltage levels corresponding to specific transistor levels. In this manner, the transistors utilized by circuit 700 are not driven into saturation by the respective input signals.

As shown in FIG. 7A, true input signal 702 (designated AYP) serves as an input to the base node of a transistor 724. The collector node of transistor 724 is connected to reference voltage node 720, and the emitter node of transistor 724 is connected toga resistance 726. In this example, transistor 724 is implemented at a first transistor level. Resistance 726 (which is connected between the emitter node of transistor 724 and reference voltage node 722) can be realized with one or more resistors connected in series or in parallel, or with any number of components/devices that provide an electrical resistance suitable to establish a specified current flow from the emitter node of transistor 724. This current flow, and the associated voltage drop from the base to the emitter of transistor 724 (Vbe≈0.8 volts) results in a 0.8 volt drop from the AYP signal 702 to the corresponding AZP signal 726. Similarly, the ALP signal 728 is 0.8 volts less than the corresponding AZP signal 726. Following this methodology, the input follower architecture produces an AZN signal 730 corresponding to a 0.8 volt drop from the complementary input signal 704 (designated AYN), and an ALN signal 732 corresponding to a 0.8 volt drop from the AZN signal 730.

Generally, the input signals in FIG. 7 are designated according to the following scheme: "original" signals (true or complementary) are designated as "Y" signals; signals associated with a Vbe drop are designated as "Z" signals; signals associated with a 2 Vbe drop are designated as "L" signals; and signals associated with a 3 Vbe drop are designated as "LL" signals. As used herein, transistors that produce "Z" signals are implemented at the first transistor level, transistors that produce "L" signals are implemented at the second transistor level, and transistors that produce "LL" signals are implemented at the third transistor level.

In the context of a practical embodiment, a logic high "Y" signal may be indicated with a true component of −0.8 volts and a complementary component of −1.1 volts. Assuming that Vbe=0.8 volts, the equivalent "Z" signal would be indicated with a true component of −1.6 volts and a complementary component of −1.9 volts, the equivalent "L" signal would be indicated with a true component of −2.4 volts and a complementary component of −2.7 volts, and the equivalent "LL" signal would be indicated with a true component of −3.2 volts and a complementary component of −3.5 volts. A "family" of signals generated by the input follower architectures are equivalent in that each signal in a family will convey the same logic high/low information. Accordingly, the following description of circuit 700 may not distinguish one equivalent input signal from another.

The different input signal "levels" correspond to the different transistor levels utilized by a practical circuit 700. The following signals depicted in FIG. 7A have corresponding counterparts depicted in FIG. 7B: AZP, AZN, ALP, ALN, BZP, BZN, BLP, BLN, FRZP, FRZN, LOCKLLP, and LOCKLLN. Signals AZP and ALP correspond to the true component 702 of the first differential input signal, signals AZN and ALN correspond to the complementary component 704 of the first differential input signal, signals BZP and BLP correspond to the true component 706 of the second differential input signal, signals BZN and BLN correspond to the complementary component 708 of the second differential input signal, signal FRZP corresponds to the true component 710 of the third differential input signal, signal FRZN corresponds to the complementary component 712 of the third differential input signal, LOCKLLP corresponds to the true component 714 of the differential select signal, and LOCKLLN corresponds to the complementary component 716 of the differential select signal.

Referring now to FIG. 7B, circuit 700 preferably comprises a plurality of transistors arranged as a plurality of differential transistor pairs. The following description refers to nine differential transistor pairs (identified by reference numbers 734, 736, 738, 740, 742, 744, 746, 748, and 750). Each of the differential transistor pairs includes two transistors, and each of the transistors includes a collector node, a base node, and an emitter node. Each of the differential transistor pairs includes a common emitter node, i.e., the two emitter nodes of the respective transistors are connected together.

Differential transistor pairs 734/736/738 are utilized by an XOR arrangement 752, and differential transistor pairs 742/744/746 are utilized by another XOR arrangement 754. XOR arrangement 752 is suitably configured to perform an XOR operation on the first and second differential input signals and to generate a suitable XOR output. In this context, the XOR operation results in a logic high output signal 718 when: (1) the first input signal represents a logic high and the second input signal represents a logic low; or (2) the first input signal represents a logic low and the second input signal represents a logic high. Conversely, the XOR operation results in a logic low output signal 718 when: (1) the first input signal represents a logic high and the second input signal represents a logic high; or (2) the first input signal represents a logic low and the second input signal represents a logic low. In the example embodiment, a logic high output signal 718 corresponds to a relatively high voltage, e.g., (Vcc−Voffset−Vbe), while a logic low output signal 718 corresponds to a relative low voltage, e.g., (Vcc−ΔV−Vbe).

XOR arrangement 754 is suitably configured to perform an equivalent XOR operation on the first and second differential input signals. The combination of the two XOR arrangements 752/754 form a symmetrical XOR arrangement configured to perform an equivalent XOR operation on the first and second differential input signals. The symmetrical XOR arrangement is utilized by the example embodiment to compensate for propagation delay variances associated with the first and second input signals, which may be undesirable in very high speed applications.

Differential transistor pair 734 includes a transistor 756 having a collector node 758, a base node 760, and an emitter node 762, and a transistor 764 having a collector node 766, a base node 768, and an emitter node 770. Using the example relative designations, transistors 756 and 764 are each implemented at the second transistor level. Collector node 758 represents the node upon which the XOR output is generated. Collector node 758 is connected to (or corresponds to): a base node 772 of an output transistor 774, one end of a resistance 778, and collector nodes associated with other transistors utilized by circuit 700. The other end of resistance 778 is connected to reference voltage node 720. Resistance 778 can be realized with one or more resistors connected in series or in parallel, or with any number of components/devices that provide an electrical resistance suitable to establish a specified-voltage drop (assuming a known current) across resistance 778. Collector node 766 is connected to (or corresponds to) one end of a resistance 776 and collector nodes associated with other transistors utilized by circuit 700. The other end of resistance 776 is connected to reference voltage node 720. Resistance 776 can be realized with one or more resistors connected in series or in parallel, or with any number of components/devices that provide an electrical resistance suitable to establish a specified voltage drop (assuming a known current) across resistance 776. Collector node 758 corresponds to a first collector node of XOR arrangement 752 and to a first collector node of the symmetrical XOR arrangement, while collector node 766 corresponds to a second collector node of XOR arrangement 752 and to a second collector node of the symmetrical XOR arrangement.

Base node 760 is suitably configured to receive the true component of the first differential input signal (identified as the AZP signal in FIG. 7B), and base node 768 is suitably configured to receive the complementary component of the first differential input signal (identified as the AZN signal in FIG. 7B). Emitter nodes 762/770 are connected together to form a common emitter node for differential transistor pair 734.

Differential transistor pair 736 includes a transistor 780 having a collector node 782, a base node 784, and an emitter node 786, and a transistor 788 having a collector node 790, a base node 792, and an emitter node 794. Using the example relative designations, transistors 780 and 788 are each implemented at the second transistor level. Collector node 782 is connected to (or corresponds to): collector node 758 of transistor 756, base node 772 of output transistor 774, one end of resistance 778, and collector nodes associated with other transistors utilized by circuit 700. Collector node 790 is connected to (or corresponds to) collector node 766 of transistor 764, to one end of resistance 776, and to collector nodes associated with other transistors utilized by circuit 700.

Base node 784 is suitably configured to receive the complementary component of the first differential input signal (identified as the AZN signal in FIG. 7B), and base node 792 is suitably configured to receive the true component of the first differential input signal (identified as the AZP signal in FIG. 7B). Although not a requirement of the present invention, base nodes 768/784 are connected together in circuit 700. Emitter nodes 786/794 are connected together to form a common emitter node for differential transistor pair 734.

Differential transistor pair 738 includes a transistor 796 having a collector node 798, a base node 800, and an emitter node 802, and a transistor 804 having a collector node 806, a base node 808, and an emitter node 810. Using the example relative designations, transistors 796 and 804 are each implemented at the third transistor level. Collector node 798 is connected to (or corresponds to) the common emitter node of differential transistor pair 734, and collector node 806 is connected to (or corresponds to) the common emitter node of differential transistor pair 736.

Base node 800 is suitably configured to receive the true component of the second differential input signal (identified as the BLP signal in FIG. 7B), and base node 808 is suitably configured to receive the complementary component of the second differential input signal (identified as the BLN signal in FIG. 7B). Emitter nodes 802/810 are connected together to form a common emitter node for differential transistor pair 738. This common emitter node also corresponds to a common emitter node for XOR arrangement 752 and to a common emitter node for the symmetrical XOR arrangement.

Differential transistor pair 740 represents a selection arrangement, which is coupled to XOR arrangement 752, XOR arrangement 754, and differential transistor pair 750. Differential transistor pair 740 includes a transistor 812 having a collector node 814, a base node 816, and an emitter node 818, and a transistor 820 having a collector node 822, a base node 824, and an emitter node 826. Using the example relative designations, transistors 812 and 820 are each implemented at the fourth transistor level. Collector node 814 is connected to (or corresponds to) the common emitter node of differential transistor pair 738, and collector node 822 is connected to (or corresponds to) other transistors utilized by circuit 700, as described in more detail below.

Base node 816 is suitably configured to receive the true component of the differential select signal (identified as the LOCKLLP signal in FIG. 7B), and base node 824 is suitably configured to receive the complementary component of the differential select signal (identified as the LOCKLLN signal in FIG. 7B). Emitter nodes 818/826 are connected together to form a common emitter node for differential transistor pair 740. This common emitter node is connected to a current source 828 that provides a constant current (to within practical tolerances) flow from reference voltage node 720 to reference voltage node 722, via conductive paths through active transistors, resistances, and possibly other elements or components of circuit 700. In accordance with one practical embodiment, current source 828 is realized with a transistor having a reference voltage applied to the base and a resistance between the emitter and reference voltage node 722. For practical embodiments, the reference voltage and resistance are selected such that current source 828 provides a substantially constant current within the range of 0.5 mA to 6.0 mA. In the example embodiment, current source provides a substantially constant current of 1.0 mA. In practice, current source 828 may be realized with any number of transistors, resistors, capacitors, and/or other components or elements.

Differential transistor pair 750 includes a transistor 830 having a collector node 832, a base node 834, and an emitter node 836, and a transistor 838 having a collector node 840, a base node 842, and an emitter node 844. Using the example relative designations, transistors 830 and 838 are each implemented at the second transistor level. Collector node 832 is connected to (or corresponds to) reference voltage node 720, and collector node 840 is connected to (or corresponds to): collector node 758 of transistor 756, collector node 782 of transistor 780, one end of resistance 778, base node 772 of output transistor 774, and collector nodes associated with other transistors utilized by circuit 700.

Base node 834 is suitably configured to receive the true component of the third differential input signal (identified as the FRZP signal in FIG. 7B), and base node 842 is suitably configured to receive the complementary component of the third differential input signal (identified as the FRZN signal in FIG. 7B). Emitter nodes 836/844 are connected together to form a common emitter node for differential transistor pair 750. This common emitter node is connected to (or corresponds to) collector node 822 of transistor 820.

Output transistor 774 includes a collector node 846, base node 772, and an emitter node 848. Collector node 846 is connected to (or corresponds to) reference voltage node 720, and emitter node 848 is connected to a current source 850. Emitter node 848, which represents an output node of circuit 700, provides output signal 718, which is derived or otherwise based upon voltage levels present at base node 772. Current source 850 preferably provides a constant current (to within practical tolerances) flow from reference voltage node 720 to reference voltage node 722, via conductive paths through active transistors, resistances, and possibly other elements or components of circuit 700. In accordance with one practical embodiment, current source 850 is realized with a resistance coupled between emitter node 848 and reference voltage node 722. In practical embodiments, the resistance is selected such that current source 850 provides a substantially constant current within the range of 1.0 mA to 4.0 mA. In the example embodiment, current source 850 provides a substantially constant current of 1.0 milliamp.

Differential transistor pairs 742, 744, 746, and 748 are arranged and interconnected in the same manner as differential transistor pairs 734, 736, 738, and 740, respectively. Accordingly, the following description of differential transistor pairs 742, 744, 746, and 748 omits some common features described above.

Differential transistor pair 742 includes a transistor 852 and a transistor 854. The base node of transistor 852 is configured to receive the true component of the second differential input signal (identified as the BZP signal in FIG. 7B), and the base node of transistor 854 is configured to receive the complementary component of the second differential input signal (identified as the BZN signal in FIG. 7B). Differential transistor pair 744 includes a transistor 856 and a transistor 858. The base node of transistor 856 is configured to receive the complementary component of the second differential input signal, and the base node of transistor 858 is configured to receive the true component of the second differential input signal.

Differential transistor pair 746 includes a transistor 860 and a transistor 862. The base node of transistor 860 is configured to receive the true component of the first differential input signal (identified as the ALP signal in FIG. 7B), and the base node of transistor 862 is configured to receive the complementary component of the first differential input signal (identified as the ALN signal in FIG. 7B). The emitter node of transistor 860 is connected to the emitter node of transistor 862 to form a common emitter node 864. Common emitter node 864 also corresponds to a common emitter node for XOR arrangement 754 and to a common emitter node for the symmetrical XOR arrangement.

Differential transistor pair 748 includes a transistor 866 and a transistor 868. The base node of transistor 866 is configured to receive the true component of the differential select signal (identified as the LOCKLLP signal in FIG. 7B), and the base node of transistor 868 is configured to receive the complementary component of the differential select signal (identified as the LOCKLLN signal in FIG. 7B).

XOR arrangement 752, in combination with differential transistor pairs 740/750, and XOR arrangement 754, in combination with differential transistor pairs 748/750, operate in an equivalent manner. Accordingly, the operation of circuit 700 will be described from the perspective of XOR arrangement 752 and differential transistor pair 740.

Differential transistor pair 740 represents a selection arrangement that operates in a first mode when the select signal (LOCKLLP and LOCKLLN) indicates a first state, and operates in a second mode when the select signal indicates a second state. In the example embodiment, if the select signal represents a logic low (i.e., the LOCKLLP voltage is low and the LOCKLLN voltage is high), then transistor 812 is off and transistor 820 is on. Consequently, no current flows through transistor 812, and no current flows through XOR arrangement 752. Current will flow through differential pair 750, however, such that differential pair 750 influences the voltage levels at base node 772 of output transistor 774. In turn, these voltage levels influence output signal 718.

Assuming that output signal 718 is only influenced by differential transistor pair 750 (i.e., the select signal represents a logic low), then the logic level represented by output signal 718 will be the same logic level represented by the third input signal (FRZP and FRZN). When the third input signal represents a logic high (i.e., the FRZP voltage is high and the FRZN voltage is low), transistor 830 is on and transistor 838 is off. As a result, current flows through transistor 830, no current flows through transistor 838, there is no voltage drop across resistance 778, the voltage at base node 772 is approximately equal to Vcc (due to practical characteristics of circuit 700, this voltage may be slightly less than Vcc, e.g., 10 mV less than Vcc), and the voltage of output signal 718 equals (Vcc−Vbe) (which represents a logic high). Conversely, when the third input signal represents a logic low, no current flows through transistor 830, current flows through transistor 838 and through resistance 778, the voltage at base node 772 is equal to (Vcc−ΔV) (where ΔV is the voltage drop across resistance 778), and the voltage of output signal 718 equals (Vcc−ΔV−Vbe) (which represents a logic low). In accordance with one practical embodiment, ΔV is approximately 400 mV.

Referring again to differential transistor pair 740, if the select signal represents a logic high (i.e., the LOCKLLP voltage is high and the LOCKLLN voltage is low), then transistor 812 is on and transistor 820 is off. Consequently, current flows through transistor 812, no current flows through transistor 820, and differential transistor pair 750 is rendered inactive. Current may flow through XOR arrangement 752, however, such that XOR arrangement 752 influences the voltage levels at base node 772 of output transistor 774. In turn, these voltage levels influence output signal 718.

Assuming that current flows through transistor 812, XOR arrangement 752 operates as follows. Differential transistor pair 738 functions as a switch that determines whether to "activate" differential transistor pair 734 or differential transistor pair 736. In the example embodiment, if the second input signal represents a logic high (i.e., the BLP voltage is high and the BLN voltage is low), then current will flow through transistor 796 and through differential transistor pair 734, and no current flows through transistor 804 or through differential transistor pair 736. If the first input signal also represents a logic high (i.e., the AZP voltage is high and the AZN voltage is low), then current will flow through transistor 756, and no current flows through transistor 764. Under these circumstances, current flows through resistance 778, the voltage at the voltage at base node 772 is equal to (Vcc−ΔV), and the voltage of output signal 718 equals (Vcc−ΔV−Vbe) (which represents a logic low, as required by the XOR operation where both inputs are high). If, however, the first input signal represents a logic low (i.e., the AZP voltage is low and the AZN voltage is high), then no current flows through transistor 756, and current will flow through transistor 764. Under these circumstances, there is less voltage drop across resistance 778 (i.e., voltage drops across resistance 776 only), the voltage at base node 772 equals (Vcc−Voffset) (where Voffset represents the voltage drop across resistance 776), and the voltage of output signal 718 equals (Vcc−Voffset−Vbe) (which represents a logic high, as required by the XOR operation where the first input is low and the second input is high). In a practical embodiment, resistance 776 is selected such that Voffset≈100 mV.

Referring again to differential transistor pair 738, if the second input signal represents a logic low (i.e., the BLP voltage is low and the BLN voltage is high) rather than a logic high, then current will flow through transistor 804 and through differential transistor pair 736, and no current flows through transistor 796 or through differential transistor pair 734. If the first input signal represents a logic high, then current will flow through transistor 788, and no current flows through transistor 780. Under these circumstances, there is less voltage drop across resistance 778, the voltage at base node 772 is equal to (Vcc−Voffset), and the voltage of output signal 718 equals (Vcc−Voffset−Vbe) (which represents a logic high, as required by the XOR operation where the first input is high and the second input is low). If, however, the first input signal also represents a logic low, then no current flows through transistor 788, and current flows through transistor 780. Under these circumstances, current flows through resistance 778, the voltage at base node 772 is equal to (Vcc−ΔV), and the voltage of output signal 718 equals (Vcc−ΔV−Vbe) (which represents a logic low, as required by the XOR operation where both inputs are low).

The operation of XOR arrangement 754 and differential transistor pairs 748/750 follows the same methodology and, indeed, yields the same results for the various scenarios described above. The symmetrical XOR arrangement is utilized to compensate for different propagation delays associated with the first and second input signals. In a practical embodiment, considering XOR arrangement 752, the propagation delay corresponding to the second input signal is slightly greater than the propagation delay corresponding to the first input signal. In contrast, considering XOR arrangement 754, the propagation delay corresponding to the first input is slightly greater than the propagation delay corresponding to the second input signal. While such slight differences can be tolerated in relatively low speed phase detection applications, a very high speed application (e.g., one handling 40 Gbps full-rate input signals) may require a higher level of precision. The use of the symmetrical XOR arrangement ensures that the ultimate output signal 718 represents "average" delay values for both the first and second input signals. This average delay will be equal for both the first and second input signals with a truly symmetrical layout.

Referring to FIG. 3, the prior art XOR circuit 300 results in one gate delay corresponding to the two input signals. Referring to FIG. 4, the prior art multiplexer circuit 400 results in one gate delay corresponding to input signal 404 (i.e., the XOR output signal 302). Consequently, the prior art configuration results in a total of two gate delays when handling the phase detect signal. In contrast, integrated XOR/MUX circuit 700 only includes a single gate delay caused by the XOR arrangement. The reduction in propagation delay enables circuit 700 to operate at a higher speed relative to the prior art configuration.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An integrated XOR/MUX device comprising:
    a first differential transistor pair having a first common emitter node, a first collector node, a second collector node, a first base node configured to receive a first input signal, and a second base node configured to receive a first complementary input signal corresponding to said first input signal;
    a second differential transistor pair having a second common emitter node, a third collector node connected to said first collector node, a fourth collector node connected to said second collector node, a third base node configured to receive said first complementary input signal, and a fourth base node configured to receive said first input signal;

a third differential transistor pair having a third common emitter node, a fifth collector node connected to said first common emitter node, a sixth collector node connected to said second common emitter node, a fifth base node configured to receive a second input signal, and a sixth base node configured to receive a second complementary input signal corresponding to said second input signal;

a fourth differential transistor pair having a fourth common emitter node connected to a current source, a seventh collector node connected to said third common emitter node, an eighth collector node, a seventh base node configured to receive a select signal, and an eighth base node configured to receive a complementary select signal corresponding to said select signal; and a fifth differential transistor pair having a fifth common emitter node connected to said eighth collector node, a ninth collector node connected to a reference voltage node, a tenth collector node connected to said first collector node, a ninth base node configured to receive a third input signal, and a tenth base node configured to receive a third complementary input signal corresponding to said third input signal.

2. A device according to claim 1, further comprising an output transistor having an eleventh base node connected to said first collector node, an eleventh collector node connected to said reference voltage node, and an emitter node connected to a second current source, said emitter node providing an output signal derived from voltage levels at said eleventh base node.

3. A device according to claim 2, wherein said output transistor generates said output signal as a single-ended signal.

4. A device according to claim 1, wherein said first differential transistor pair, said second differential transistor pair, and said third differential transistor pair form an XOR arrangement configured to perform an XOR operation based upon said first input signal, said first complementary input signal, said second input signal, and said second complementary input signal.

5. A device according to claim 4, wherein:

said first input signal and said first complementary input signal represent a first differential input signal to said XOR arrangement; and said second input signal and said second complementary input signal represent a second differential input signal to said XOR arrangement.

6. A device according to claim 5, wherein:

voltage levels at first collector node represent an output signal;

if said fourth differential transistor pair is operating in a first mode controlled by said select signal and said complementary select signal, said XOR arrangement influences said output signal; and if said fourth differential transistor pair is operating in a second mode controlled by said select signal and said complementary select signal, said fifth differential transistor pair influences said output signal.

7. A device according to claim 1, wherein:

said first common emitter node, said first collector node, and said first base node correspond to a first transistor;

said first common emitter node, said second collector node, and said second base node correspond to a second transistor;

said second common emitter node, said third collector node, and said third base node correspond to a third transistor;

said second common emitter node, said fourth collector node, and said fourth base node correspond to a fourth transistor;

said third common emitter node, said fifth collector node, and said fifth base node correspond to a fifth transistor;

said third common emitter node, said sixth collector node, and said sixth base node correspond to a sixth transistor;

said fourth common emitter node, said seventh collector node, and said seventh base node correspond to a seventh transistor;

said fourth common emitter node, said eighth collector node, and said eighth base node correspond to an eighth transistor;

said fifth common emitter node, said ninth collector node, and said ninth base node correspond to a ninth transistor; and said fifth common emitter node, said tenth collector node, and said tenth base node correspond to a tenth transistor.

8. A device according to claim 1, further comprising a resistance connected between said reference voltage node and said first collector node.

9. An integrated XOR/MUX device comprising:

an XOR arrangement having a first collector node, a second collector node, and a first common emitter node, said XOR arrangement being configured to perform an XOR operation on a first differential input signal and a second differential input signal;

a first differential transistor pair having a second common emitter node connected to a current source, a third collector node connected to said first common emitter node, and a fourth collector node, said first differential transistor pair being configured to receive a differential select signal; and a second differential transistor pair having a third common emitter node connected to said fourth collector node, a fifth collector node connected to a reference voltage node, and a sixth collector node connected to said first collector node, said second differential transistor pair being configured to receive a third differential input signal.

10. A device according to claim 9, further comprising an output transistor having a base node connected to said first collector node, a seventh collector node connected to said reference voltage node, and an emitter node connected to a second current source, said emitter node providing an output signal derived from voltage levels at said base node.

11. A device according to claim 9, wherein:

voltage levels at said first collector node represent an output signal;

if said first differential transistor pair is operating in a first mode controlled by said differential select signal, said XOR arrangement influences said output signal; and if said first differential transistor pair is operating in a second mode controlled by said differential select signal, said second differential transistor pair influences said output signal.

12. A device according to claim 9, wherein said XOR arrangement comprises:

a third differential transistor pair having a fourth common emitter node, a seventh collector node corresponding to said first collector node, an eighth collector node corresponding to said second collector node, a first base node configured to receive the true component of said first differential input signal, and a second base node configured to receive the complementary component of said first differential input signal;

a fourth differential transistor pair having a fifth common emitter node, a ninth collector node corresponding to said first collector node, a tenth collector node corresponding to said second collector node, a third base node configured to receive the complementary component of said first differential input signal, and a fourth base node configured to receive the true component of said first differential input signal; and a fifth differential transistor pair having a sixth common emitter node corresponding to said first common emitter node, an eleventh collector node connected to said fourth common emitter node, a twelfth collector node connected to said fifth common emitter node, a fifth base node configured to receive the true component of said second differential input signal, and a sixth base node configured to receive the complementary component of said second differential input signal.

13. A device according to claim 9, further comprising a resistance connected between said reference voltage node and said first collector node.

14. An integrated XOR/MUX device comprising:

a symmetrical XOR arrangement having a first collector node, a second collector node, a first common emitter node, and a second common emitter node, said symmetrical XOR arrangement being configured to perform an XOR operation on a first differential input signal and a second differential input signal;

a first differential transistor pair having a third common emitter node connected to a first current source, a third collector node connected to said first common emitter node, and a fourth collector node, said first differential transistor pair being configured to receive a differential select signal;

a second differential transistor pair having a fourth common emitter node connected to a second current source, a fifth collector node connected to said second common emitter node, and a sixth collector node connected to said fourth collector node, said second differential transistor pair being configured to receive said differential select signal; and a third differential transistor pair having a fifth common emitter node connected to said fourth collector node, a seventh collector node connected to a reference voltage node, and an eighth collector node connected to said first collector node, said third differential transistor pair being configured to receive a third differential input signal.

15. A device according to claim 14, further comprising an output transistor having a base node connected to said first collector node, a ninth collector node connected to said reference voltage node, and an emitter node connected to a third current source, said emitter node providing an output signal derived from voltage levels at said base node.

16. A device according to claim 14, wherein:

voltage levels at said first collector node represent an output signal;

if said first differential transistor pair and said second differential transistor pair are both operating in a first mode controlled by said differential select signal, said symmetrical XOR arrangement influences said output signal; and if said first differential transistor pair and said second differential transistor pair are both operating in a second mode controlled by said differential select signal, said third differential transistor pair influences said output signal.

17. A device according to claim 14, wherein said symmetrical XOR arrangement comprises:

a fourth differential transistor pair having a sixth common emitter node, a ninth collector node corresponding to said first collector node, a tenth collector node corresponding to said second collector node, a first base node configured to receive the true component of said first differential input signal, and a second base node configured to receive the complementary component of said first differential input signal;

a fifth differential transistor pair having a seventh common emitter node, an eleventh collector node corresponding to said first collector node, a twelfth collector node corresponding to said second collector node, a third base node configured to receive the complementary component of said first differential input signal, and a fourth base node configured to receive the true component of said first differential input signal; and a sixth differential transistor pair having an eighth common emitter node corresponding to said first common emitter node, a thirteenth collector node connected to said sixth common emitter node, a fourteenth collector node connected to said seventh common emitter node, a fifth base node configured to receive the true component of said second differential input signal, and a sixth base node configured to receive the complementary component of said second differential input signal.

18. A device according to claim 17, wherein said symmetrical XOR arrangement comprises:

a seventh differential transistor pair having a ninth common emitter node, a fifteenth collector node corresponding to said first collector node, a sixteenth collector node corresponding to said second collector node, a seventh base node configured to receive the true component of said second differential input signal, and an eighth base node configured to receive the complementary component of said second differential input signal;

an eighth differential transistor pair having a tenth common emitter node, a seventeenth collector node corresponding to said first collector node, an eighteenth collector node corresponding to said second collector node, a ninth base node configured to receive the complementary component of said second differential input signal, and a tenth base node configured to receive the true component of said second differential input signal; and a ninth differential transistor pair having an eleventh common emitter node corresponding to said second common emitter node, a nineteenth collector node connected to said ninth common emitter node, a twentieth collector node connected to said tenth common emitter node, an eleventh base node configured to receive the true component of said first differential input signal, and a twelfth base node configured to receive the complementary component of said first differential input signal.

19. A device according to claim 14, further comprising a resistance connected between said reference voltage node and said first collector node.

20. An integrated XOR/MUX device comprising:

an output node configured to provide an output signal;

an XOR arrangement coupled to said output node, said XOR arrangement comprising at least one transistor implemented at a first relative transistor level and at least one transistor implemented at a second relative transistor level, said XOR arrangement being configured to receive a first input signal and a second input signal and to generate an XOR output based upon said first input signal and said second input signal;

a selection arrangement coupled to said XOR arrangement, said selection arrangement comprising at least one transistor implemented at a third relative transistor level, said selection arrangement being configured to receive a select signal; wherein in response to a first state of said select signal, said XOR output influences said output signal; and in response to a second state of said select signal, a third input signal received by said XOR/MUX device influences said output signal.

21. A device according to claim 20, further comprising a differential transistor pair coupled to said output node and to said selection arrangement, said differential transistor pair being configured to receive said third input signal.

22. A device according to claim 21, wherein said differential transistor pair comprises at least one transistor implemented at said first relative transistor level.

23. A device according to claim 21, wherein said XOR arrangement and said differential transistor pair are each coupled to said output node via an output transistor.

\* \* \* \* \*